(12) United States Patent
Horiuchi

(10) Patent No.: US 10,410,898 B2
(45) Date of Patent: Sep. 10, 2019

(54) MOUNTING MEMBER

(71) Applicant: KYOCERA Corporation, Kyoto-shi, Kyoto (JP)

(72) Inventor: Masahiko Horiuchi, Yasu (JP)

(73) Assignee: KYOCERA Corporation, Kyoto-shi, Kyoto (JP)

(*) Notice: Subject to any disclaimer, the term of this patent is extended or adjusted under 35 U.S.C. 154(b) by 277 days.

(21) Appl. No.: 15/327,497

(22) PCT Filed: Jul. 22, 2015

(86) PCT No.: PCT/JP2015/070862
§ 371 (c)(1),
(2) Date: Jan. 19, 2017

(87) PCT Pub. No.: WO2016/013589
PCT Pub. Date: Jan. 28, 2016

(65) Prior Publication Data
US 2017/0186641 A1    Jun. 29, 2017

(30) Foreign Application Priority Data
Jul. 22, 2014   (JP) .................................. 2014-148850

(51) Int. Cl.
*H01L 21/683* (2006.01)
*G03F 7/20* (2006.01)
(Continued)

(52) U.S. Cl.
CPC ...... *H01L 21/6833* (2013.01); *G03F 7/70708* (2013.01); *G03F 7/70875* (2013.01); *H01L 21/67103* (2013.01); *H01L 21/67109* (2013.01); *H01L 21/6831* (2013.01); *H01L 21/6875* (2013.01)

(58) Field of Classification Search
USPC ......................................................... 361/234
See application file for complete search history.

(56) References Cited

U.S. PATENT DOCUMENTS 6,888,236 B2 * 5/2005 Hiramatsu ............ C04B 35/581
257/620
2005/0105243 A1 * 5/2005 Lee ..................... H01L 21/6833
361/234
(Continued)

FOREIGN PATENT DOCUMENTS

EP        2642511 A1    9/2013
JP     2000-354957 A   12/2000
(Continued)

OTHER PUBLICATIONS

International Search Report (Form PCT/ISA/210) issued for PCT/JP2015/070862, dated Oct. 13, 2015.
(Continued)

*Primary Examiner* — Danny Nguyen
(74) *Attorney, Agent, or Firm* — Viering, Jentschura & Partner MBB

(57) ABSTRACT

A mounting member includes a body having a surface including a mounting surface on which an object is mountable, a channel arranged in the body, and a first layer arranged on an inner surface of the channel. The first layer has a higher thermal conductivity than the body.

18 Claims, 5 Drawing Sheets

(51) Int. Cl.
*H01L 21/67* (2006.01)
*H01L 21/687* (2006.01)

(56) References Cited

U.S. PATENT DOCUMENTS

| | | |
|---|---|---|
| 2005/0260938 A1 | 11/2005 | Okuda et al. |
| 2008/0212640 A1 | 9/2008 | Sasaki et al. |
| 2009/0168292 A1* | 7/2009 | Watanabe ........... H01L 21/6831 361/234 |

FOREIGN PATENT DOCUMENTS

| | | |
|---|---|---|
| JP | 2001-096454 A | 4/2001 |
| JP | 2014-082476 A | 5/2014 |
| WO | 2012/067239 A1 | 5/2012 |
| WO | 2013051713 A1 | 4/2013 |
| WO | 2014/084334 A1 | 6/2014 |

OTHER PUBLICATIONS

Written Opinion (Form PCT/ISA/237) issued for PCT/JP2015/070862, dated Oct. 13, 2015.

* cited by examiner

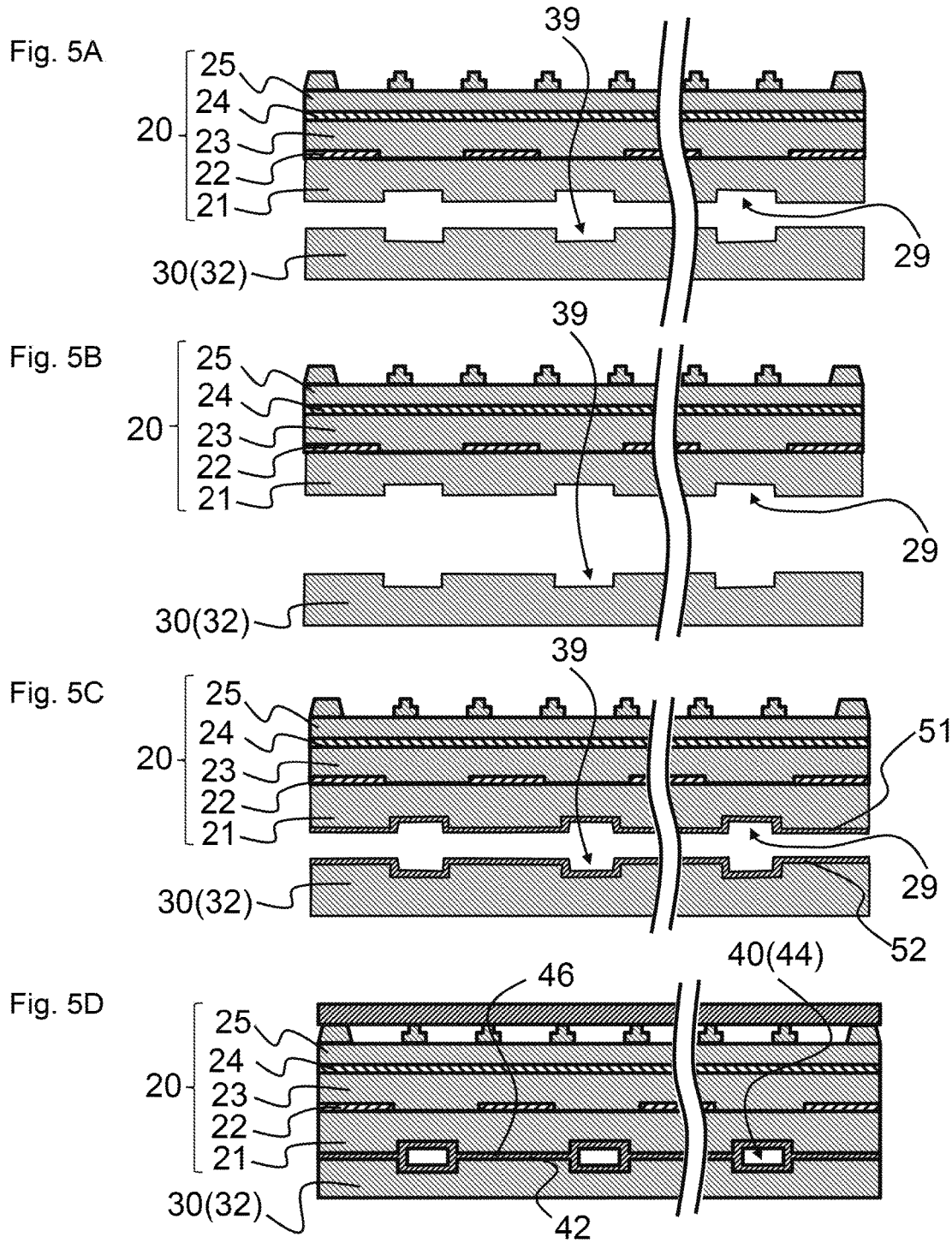

MOUNTING MEMBER

FIELD

The present invention relates to a mounting member on which an object, such as a wafer or a glass substrate, is mounted in the manufacturing processes of, for example, semiconductor integrated circuits or liquid crystal displays.

BACKGROUND

An exposure apparatus used in the manufacture of semiconductor devices or liquid crystal displays reduces the size of a highly-complicated circuit pattern formed on a photomask through a high-performance lens, and projects the pattern onto a wafer to form a fine pattern on the wafer. The exposure apparatus illuminates selective areas on the wafer (exposure areas) with laser light to generate thermal energy in the areas. The exposure areas can easily heat up partially. The exposure performed with the exposure apparatus is often repeated a number of times. During the exposure, the wafer, as well as the mounting member on which the wafer is mounted, can heat up partially. The wafer with varying temperatures can have different states of exposure. The mounting member is thus designed to narrow the temperature distribution in the wafer (object) by lowering the temperature of the partially heated wafer or mounting member.

For example, Patent Literature 1 below describes a mounting member including a ceramic body, on which a wafer is mounted, and heating elements and channels for a cooling fluid both arranged in the ceramic body.

CITATION LIST

Patent Literature

Patent Literature 1: WO 2012/067239

BRIEF SUMMARY

Technical Problem

The mounting member described in Patent Literature 1 allows a fluid, such as water, to flow inside the channels, which each have an uncovered ceramic inner surface. Through the inner surface of each channel, the fluid flowing in each channel directly exchanges heat with the body. To lower the temperature of the partially heated body in a relatively short time, the efficiency of heat exchange between the inner surface of each channel and the fluid is to be relatively high. The mounting member described in Patent Literature 1 having each channel with the uncovered ceramic inner surface has a relatively low efficiency of heat exchange between the inner surface of each channel and the fluid, and thus takes a relatively long time to narrow the temperature distribution in the body.

Solution to Problem

In response to the above issue, one or more aspects are directed to a mounting member including a body with a surface including a mounting surface on which an object is mountable, channels arranged in the body, and a first layer having a higher thermal conductivity than the body arranged on the inner surface of each channel.

Advantageous Effects

The temperature distribution in the body is narrowed in a relatively short time.

BRIEF DESCRIPTION OF DRAWINGS

FIGS. 5A to 5D are schematic cross-sectional views of an electrostatic chuck illustrating its manufacturing method according to one embodiment.

DETAILED DESCRIPTION

Figure 1:
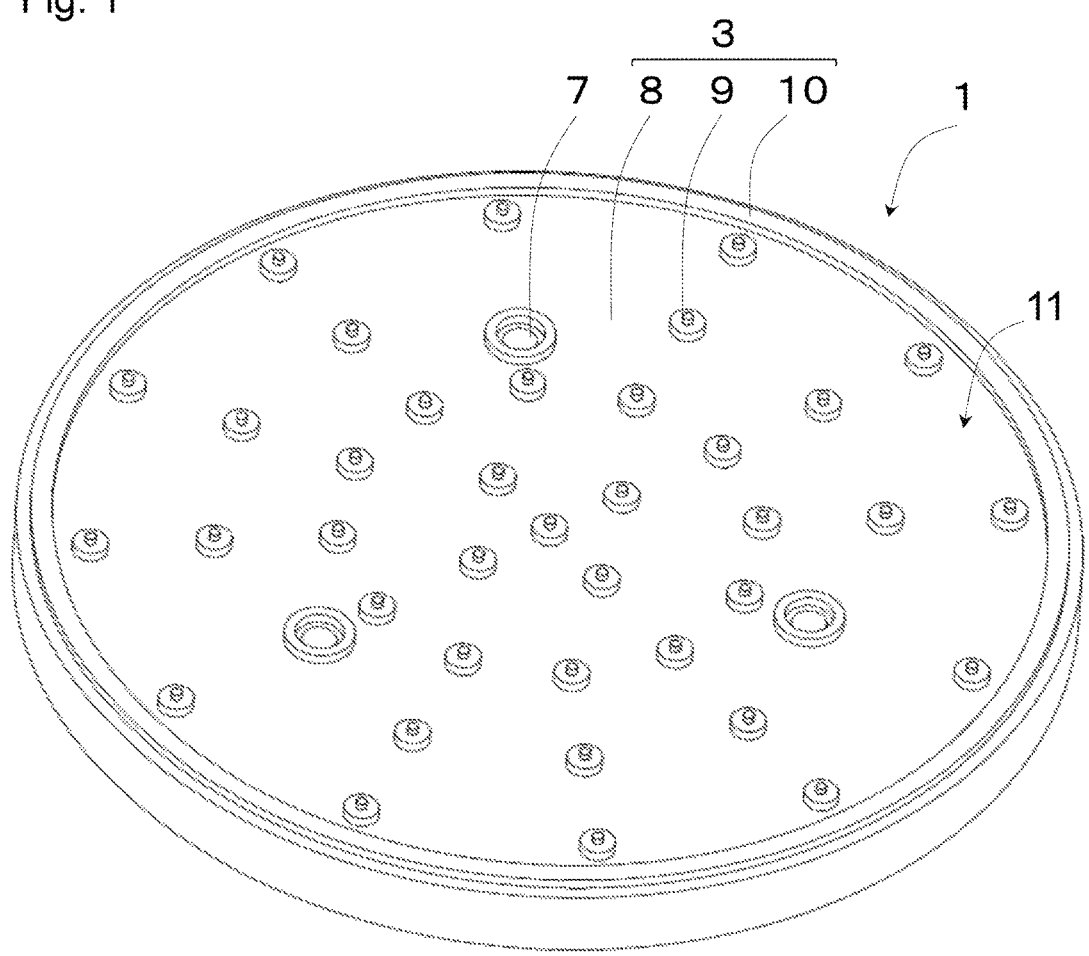
FIG. 1 is a perspective view of an electrostatic chuck as a mounting member according to one embodiment.

A mounting member according to one embodiment will now be described in detail with reference to the drawings. An electrostatic chuck 1, which is a mounting member according to one embodiment, has one main surface serving as a mounting surface 3, on which an object 2 such as a wafer is mounted. The electrostatic chuck 1 attracts the object 2 with an electrostatic force and retains the object 2. The electrostatic chuck 1 may be incorporated in, for example, various apparatuses including an exposure apparatus and an inspection apparatus. Such various apparatuses are used in the manufacturing processes of, for example, semiconductor integrated circuits or liquid crystal displays. The object 2 attracted on the electrostatic chuck 1 undergoes various processes in such apparatuses.

For example, the exposure apparatus includes the electrostatic chuck 1 and a light source. The exposure apparatus illuminates the object 2 attracted on the electrostatic chuck 1 with light from the light source to expose the object 2 with light and form a wiring pattern. The electrostatic chuck 1 electrostatically attracts the object 2 with a Johnsen-Rahbeck or a Coulomb force.

The electrostatic chuck 1 includes a body 11, which is a laminate of a first structure 20 and a second structure 30. The first structure 20 includes a first insulating layer 21, heaters 22 for adjusting the temperature of the mounting surface 3, a second insulating layer 23, an attracting electrode layer 24, and a third insulating layer 25 including the mounting surface 3. The second structure 30 includes a fourth insulating layer 32.

The first insulating layer 21, the second insulating layer 23, and the third insulating layer 25 in the first structure 20 and the fourth insulating layer 32 in the second structure 30 are formed from, for example, a ceramic material containing, as its major constituent, sintered aluminum oxide, sintered aluminum nitride, sintered silicon nitride, sintered cordierite, or sintered silicon carbide (SiC or Si—SiC).

The electrostatic chuck 1 is prepared by firing a laminate of green sheets, which are formed by tape casting. The heaters 22 and the attracting electrode layer 24, which will be described later, are prepared by forming metallic paste layers on the green sheets by, for example, screen printing, and sintering the metallic paste layers together with the green sheets.

Figure 2:
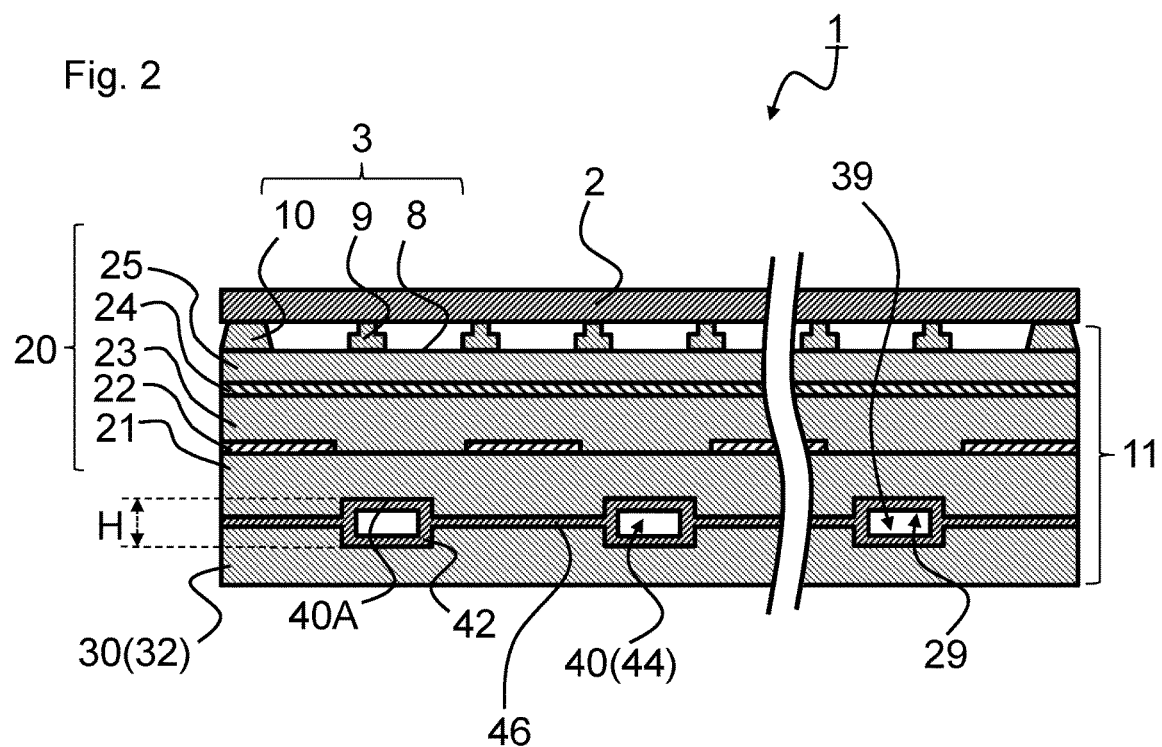
FIG. 2 is a cross-sectional view of the electrostatic chuck shown in FIG. 1.

The body 11 in the present embodiment is disc-shaped. The total thickness of the first structure 20 and the second structure 30 is, for example, in a range of 1 to 50 mm inclusive. The width (diameter) of the mounting surface 3 is, for example, in a range of 25 to 3500 mm inclusive. The mounting surface 3 functions as a surface for attracting the object 2. As shown in FIGS. 1 and 2, the mounting surface 3 includes a bottom 8, a plurality of protrusions 9 on the bottom 8, and a surrounding wall 10. The protrusions 9 are arranged in an area defined by the surrounding wall 10. The body 11 further has through-holes 7, which extend across the thicknesses of the first structure 20 and the second structure 30. The through-holes 7 can receive lift pins (not shown), which are inserted.

The protrusions 9 function as supports for the object 2. The protrusions 9 are, for example, columnar. The surrounding wall 10 also comes in contact with the object 2 to seal a gap between the bottom 8 and the object 2. The surrounding wall 10 is, for example, circular or square as viewed from above. The thickness of the surrounding wall 10 (the distance between its outer surface and its inner surface) is, for example, in a range of 0.01 to 5 mm inclusive. The heaters 22 are formed from, for example, a metal such as tungsten as the main constituent. Each heater 22 has a pair of electric wires (not shown) connected to supply a current. The electric wires, which are for example coated copper wires, are connected to the heaters 22 by soldering or with a conductive adhesive.

Each heater 22 further has a temperature sensor (not shown) for detecting the heater temperature. The temperature sensor connected to each heater 22 operates during use of the electrostatic chuck 1 (while the electrostatic chuck 1 is attracting and retaining the wafer). The temperature sensors (not shown) are, for example, resistance thermometer sensors or thermocouples. The temperature sensors (not shown) in the electrostatic chuck 1 and the electric wires are connected to a temperature controller (not shown). When detecting any deviation between the temperature of each heater 22 detected by the temperature sensor and its preset temperature (intended temperature), the temperature controller (not shown) activates the heaters 22 arranged for low temperature areas to generate heat and increase the temperature of such areas. This narrows the temperature distribution across the mounting surface 3.

The electrostatic chuck 1 includes the body 11 with its surface including the mounting surface 3 for the object 2, channels 40 arranged in the body 11, and a first layer 42 having a higher thermal conductivity than the body 11 arranged on the inner surface of each channel 40. Each channel 40 allows a fluid 44, such as water, to flow through it for adjusting the temperature of the mounting surface 3. The fluid 44 may be a liquid or a gas. The first layer 42 has a higher thermal conductivity than the body 11. Unlike when, for example, the inner surface of each channel 40 is an uncovered surface part of the ceramic body 11, this structure can narrow the temperature distribution in the body 11 in a relatively short time.

The body 11 further includes the attracting electrode layer 24, which receives an applied voltage for attracting the object 2 toward the mounting surface 3. The attracting electrode layer 24 is arranged nearer the mounting surface 3 than the channels 40.

As shown in FIG. 2, the electrostatic chuck 1 includes a second layer 46 having a higher thermal conductivity than the body 11. The second layer 46 extends in an area along the mounting surface 3 in a manner to avoid the channels 40 as viewed from above. The first layers 42 connect to the second layer 46. The first layers 42 connecting to the second layer 46 can exchange heat with the body 11 through the second layer 46 arranged to avoid the channels 40. This structure narrows the temperature distribution in the body 11 in a shorter time. The first layers 42 in adjacent channels 40 are connected by the second layer 46 to reduce the temperature difference between the first layers 42 in the channels 40. This structure reduces the temperature difference between parts of the body 11 around the channels 40, and narrows the temperature distribution in the body 11 in a shorter time.

The electrostatic chuck 1 includes the plurality of channels 40 arranged parallel to one another along the mounting surface 3 at the cross-section perpendicular to the mounting surface 3. The body 11 includes the second layer 46, which extends between the channels 40. The second layer 46 has a higher thermal conductivity than the body 11. The first layers 42 connect to the second layer 46. Each first layer 42 may be arranged to cover the entire inner surface of the corresponding channel 40. The first layer 42 covering the entire inner surface of each channel 40 allows easy thermal diffusion across the entire inner surface of each channel 40. This further shortens the time taken to narrow the temperature distribution in the body 11.

In the electrostatic chuck 1, the second layer 46 in the body 11 is located within the range of the height of each channel 40 at the cross-section perpendicular to the mounting surface 3. The range of the height of each channel 40 refers to an area at the cross-section perpendicular to the mounting surface 3 (height range H in FIG. 2) that is defined by a line parallel to the mounting surface 3 drawn on a part of each channel 40 nearest the mounting surface 3 and a line parallel to the mounting surface 3 drawn on a part of each channel 40 furthest from the mounting surface 3. The second layer 46 is located within the height range H to allow heat exchange through a relatively short route around each channel 40. This structure narrows the temperature difference around each channel 40 in the body 11 in a relatively short time.

The second layer 46 may extend across the entire area inward from the outermost periphery S of the channels 40 (refer to FIG. 3) in a manner to avoid the channels 40 as viewed from above. More specifically, the second layer 46 in the electrostatic chuck 1 extends without leaving space across the entire area in which the channels 40 are arranged. This structure reduces the temperature difference around each channel 40 in a relatively short time in the entire area of the body 11 in which the channels 40 are arranged.

The first layers 42 and the second layer 46 contain the same major constituent. The major constituent refers to a constituent of 50% or more by mass. When no constituent constitutes 50% or more by mass, the major constituent refers to a constituent with the largest content. The first layers 42 and the second layer 46 containing the same major constituent can have a smaller thermal conductivity distribution, and thus can reduce the temperature difference around each channel 40 in a relatively short time.

The first layers 42 and the second layer 46 are both metallic films containing gold (Au) as their major constituent. The first layers 42 and the second layer 46 in the present embodiment, which are metallic films, are both conductive. A metallic film typically contains about 50% of metallic elements or more by mass in total. The metallic elements may be in the form of carbides, nitrides, and oxides, or may be alloys of different metals. The first layers 42 and the second layer 46 are grounded with electric wiring (not shown). The major constituent of the first layers 42 and the second layer 46 may be another metal, such as copper (Cu), aluminum (Al), or nickel (Ni). The major constituent of the first layers 42 and the second layer 46 may be gold (Au), which has a relatively high thermal conductivity, a relatively low electric resistance, and less easy corrosion in the presence of water or other matter. The first layers 42 and the second layer 46 may be films with any other major constituent having a higher thermal conductivity than the body 11, or for example may be films containing an inorganic substance as their major constituent, such as oxide films or nitride films, or may be films containing an organic substance as their major constituent.

In the electrostatic chuck 1, the first layer 42 arranged on the inner surface of each channel 40 prevents the fluid 44 flowing through each channel 40 from directly contacting the ceramic parts of each channel 40 (the first insulating layer 21 and the fourth insulating layer 32). The first layers 42 that are metallic films containing gold as their major constituent are less reactive than ceramic with the fluid 44, which is a liquid such as water. The electrostatic chuck 1 includes the first layer 42 on the inner surface of each channel 40 to reduce or delay corrosion of the body 11, which can otherwise be caused by the fluid flowing through each channel 40.

In the electrostatic chuck 1, charges created by contact between the fluid 44 and the first layers 42 can easily escape out of the channels 40 through the first layers 42 and the second layer 46 that are conductive. The electrostatic chuck 1 is thus less susceptible to static electricity generated by the fluid 44.

Figure 3:
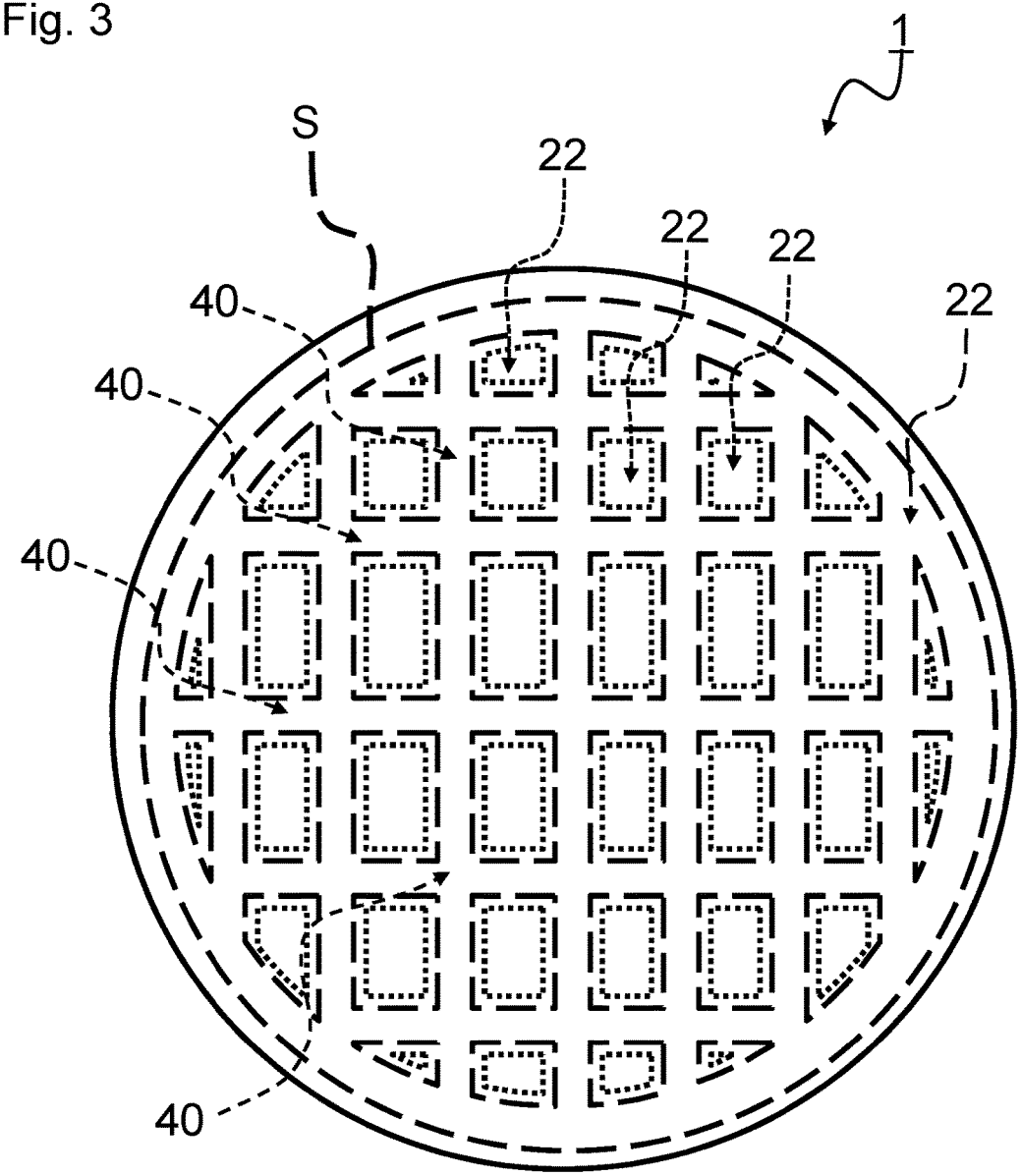
FIG. 3 is a top view of the electrostatic chuck shown in FIG. 1 illustrating the arrangement of its channels and heaters.

As shown in FIG. 3, the channels 40 in the body 11 are arranged in a lattice pattern along the mounting surface 3, and the heaters 22 are arranged in the body 11. When, for example, the fluid 44 at 20 to 25° C. is fed through the channels 40, the fluid 44 flows inside the electrostatic chuck 1 across the entire mounting surface 3. The channels 40 and the heaters 22 may have any shapes. For example, the channels 40 and the heaters 22 may meander across the mounting surface 3 or may be spiral. The body 11 may include a plurality of channels 40 that are independently separate from one another. The shapes and the arrangement of the channels 40 and the heaters 22 may be designed as appropriate for their use or intended performance.

The first layers 42 and the second layer 46 in the body 11 extend across the mounting surface 3. In detail, the first layers 42 and the second layer 46 extend continuously across the mounting surface 3 when viewed through from above. The first layers 42 and the second layer 46, which extend across the mounting surface 3, narrow the temperature distribution in the body 11 and across the mounting surface 3 in a shorter time.

As described above, the body 11 includes the first structure 20 having the mounting surface 3, the second structure 30 arranged at the surface of the first structure 20 opposite to the mounting surface 3, and the second layer 46 arranged between the first structure 20 and the second structure 30 to bond these structures. The second layer 46 bonding the first and second structures 20 and 30 allows relatively low-cost preparation of the mounting member including the first layers 42 and the second layer 46. A method for manufacturing the electrostatic chuck 1 will be described in detail later.

The first structure 20 includes first recesses 29, which are grooves, on its surface (lower main surface in the figure) opposite to the mounting surface 3. The inner surface of each channel 40 includes an inner surface of the corresponding first recess 29. In this structure including the first recesses 29 in the main surface of the first structure 20 and each channel 40 having its inner surface including the inner surface of the corresponding first recess 29, the first layers 42 arranged directly in the first structure 20 can directly exchange heat with the fluid 44. This narrows the temperature distribution in the first structure 20 and in the body 11 in a shorter time. The second structure 30 includes second recesses 39, which are grooves, on its main surface adjacent to the first structure 20. The inner surface of each channel 40 includes an inner surface of the corresponding second recess 39. This narrows the temperature distribution in the second structure 30 and in the body 11 in a shorter time.

In more detail, the first structure 20 and the second structure 30 of the electrostatic chuck 1 are stacked to have the first recesses 29 and the second recesses 39 aligned with each other as shown in FIG. 2. The lower surface of the first structure 20 and the upper surface of the second structure 30 in FIG. 2 are bonded by the second layer 46 containing, for example, gold (Au) as its major constituent. Further, the inner surface of each channel 40, which is defined by the first recess 29 and the second recess 39 aligned with each other, is entirely covered by the first layer 42, which is integrally continuous to the second layer 46. The second layer 46 and the first layers 42 are formed by, for example, vacuum deposition. The first layers 42 and the second layer 46, which are integrally continuous to each other, electrically insulate between the first structure 20 and the second structure 30.

As described above, the electrostatic chuck 1 includes the attracting electrode 24 in the first structure 20, and includes the first layers 42 and the second layer 46, which are both conductive When, for example, a relatively high voltage for attracting the object 2 is applied to the attracting electrode layer 24 in the first structure 20, the first layers 42 and the second layer 46 that are grounded prevent the applied attracting voltage from electrically affecting the parts of the second structure 30. When the attracting electrode layer 24 receives a relatively high applied voltage, the first layer 42 covering the inner surface of each channel 40 allows a relatively low voltage to be applied to the fluid 44 in each channel 40. This reduces alternation of the fluid 44 (e.g., electrolysis), which can otherwise be caused by the applied voltage.

Figure 4A:
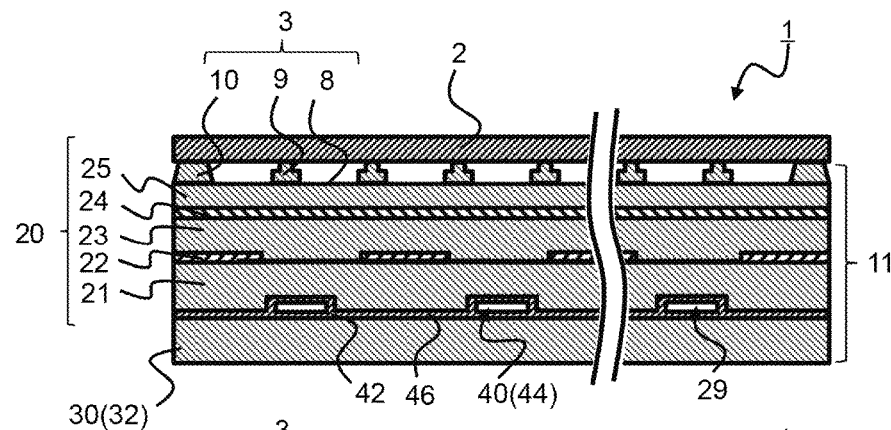
FIGS. 4A to 4D are cross-sectional views of electrostatic chucks according to other embodiments.
Figure 4B:
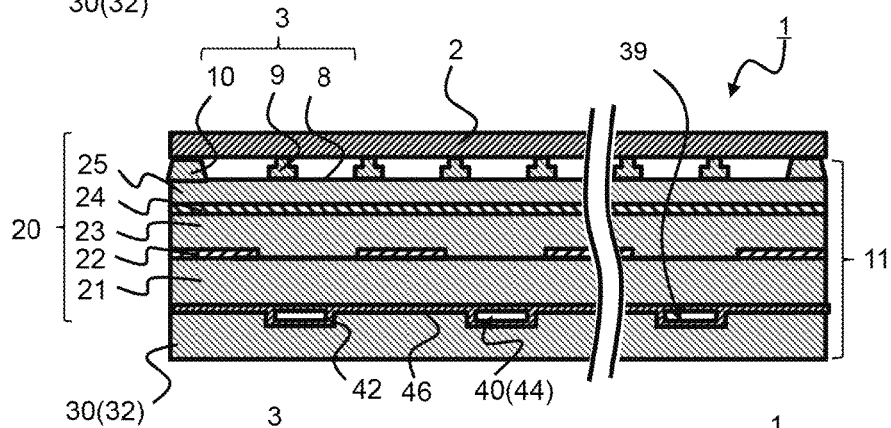

FIGS. 4A to 4D are cross-sectional views of electrostatic chucks according to other embodiments. As shown in FIG. 4A, each channel 40 may be defined by the first recess 29 and the main surface of the second structure 30, and the second recesses 39 may be eliminated. As shown in FIG. 4B, each channel 40 may be defined by the second recess 39 and the main surface of the first structure 20, and the first recesses 29 may be eliminated. To allow each channel 40 to have a relatively large inner surface area as well as to narrow the temperature distribution in the first structure 20 and the third structure 30 in a shorter time, the electrostatic chuck may include both the first recesses 29 and the second recesses 39 as in the above embodiment.

Figure 4C:
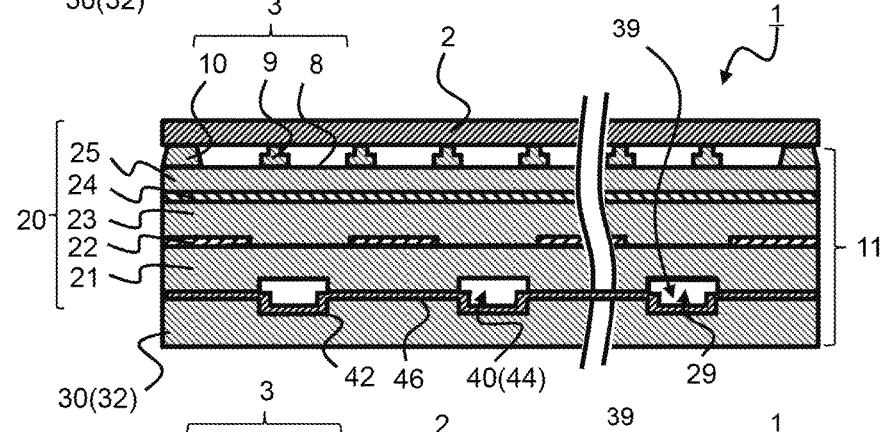
Figure 4D:
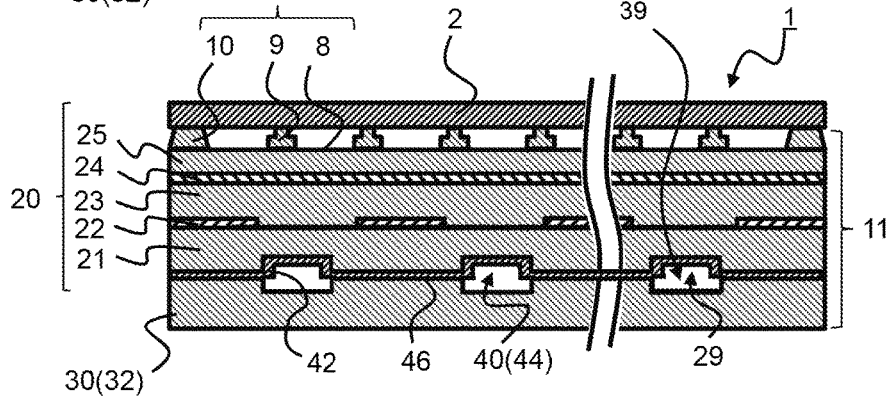

As shown in FIG. 4C, the first layer 42 may extend partially to uncover, for example, the surface of each first recess 29. As shown in FIG. 4D, the first layer 42 may extend partially to uncover, for example, the surface of each second recess 39. To narrow the temperature distribution in the body 11 in a shorter time, the first layer 42 may be arranged entirely on both the inner surface of each first recess 29 and the inner surface of each second recess 30 as in the above embodiment.

The method for manufacturing the electrostatic chuck 1 according to one embodiment will now be described. FIGS. 5A to 5D are schematic cross-sectional views of the electrostatic chuck 1 illustrating its manufacturing method according to one embodiment. The electrostatic chuck 1 according to the present embodiment is prepared by forming a metallic film on the surface of each of the first structure 20 and the second structure 30, which are formed by tape casting, and bonding these metallic films by atomic diffusion bonding.

As shown in FIG. 5A, the first structure 20 and the second structure 30 are prepared first. The first structure 20 and the second structure 30 are each prepared by, for example, firing a laminate of green sheets, which are formed by tape casting. For example, a first green sheet having first recesses 29 shaped to be the channels 40 is prepared to be the first insulating layer 21. A paste layer containing a metal such as tungsten as its major constituent is formed on the upper surface of the first green sheet in FIG. 5A. This paste layer is patterned to be the heaters 22 by, for example, screen printing. A second green sheet to be the second insulating layer 23, which is cut from a tape similar to the tape for the first green sheet, is placed on one surface of the first green sheet. The second green sheet has a paste layer containing a metal such as gold (Au) as its major constituent on its upper surface in FIG. 5A. This paste layer is patterned to be the attracting electrode layer 24 by, for example, screen printing. A third green sheet to be the third insulating layer 25, which is cut from a tape similar to the tape for the first green sheet, is then placed on one surface of the second green sheet. The upper surface of the third insulating layer 25 in FIG. 5A has parts that have been shaped to be the protrusions 9 and the surrounding wall 10. The first to third insulating layers are then tightly pressed together under airpress, and then are degreased and fired to prepare the first structure 20. The second structure 30 is prepared by forming a laminate of a plurality of green sheets with the second recesses 39, and then degreasing and firing the structure. The heaters 22 and the attracting electrode layer 24 are prepared by forming metallic paste layers on the surfaces of those green sheets by, for example, screen printing, and then sintering the metallic paste layers together with the green sheets.

Subsequently, as shown in FIG. 5B, the lower surface of the first insulating layer 21 in FIG. 5B (the surface having the first recesses 29) and the upper surface of the fourth insulating layer 32 in FIG. 5B (the surface having the second recesses 39) are polished to reduce their surface roughness. The polishing is performed with, for example, a diamond slurry, to have the calculated average surface roughness of 1 µm or less. The calculated average roughness of the polished surfaces is to be small, and may be, for example, 10 nm or less.

Subsequently, as shown in FIG. 5C, a metallic film 51 containing, for example, gold (Au) as its major constituent is formed on the entire lower surface of the first insulating layer 21 shown in FIG. 5C including the inner surface of each first recess 29 by a thin film deposition method known in the art, such as sputtering. The thickness of the metallic film 51 is, for example, about 50 to 500 nm. In the same manner, a metallic film 52 containing gold (Au) as its major constituent is formed on the entire lower surface of the first insulating layer 21 shown in FIG. 5C including the inner surface of each second recess 39 by a thin film deposition method known in the art, such as sputtering. The thickness of the metallic film 52 is, for example, about 50 to 500 nm.

Subsequently, as shown in FIG. 5D, the metallic layer 51 on the first insulating layer 21 and the fourth metallic layer 32 on the fourth insulating layer 32 are placed in contact with each other to bond the first insulating layer 21 and the fourth insulating layer 32, or in other words, the first structure 20 and the third structure 30. For this bonding, the first structure 20 and the third structure 30 may be pressed against each other under a load applied to achieve a relatively high bonding strength.

The metallic layers formed by, for example, sputtering are microcrystalline thin films. Such microcrystalline thin films are combined together to cause atomic diffusion at the bonding interface between these thin films. This enables strong bonding between the two substrates. For example, gold (Au) is a metal with positive free energy of formation of oxides at room temperature. The gold-based layer is thus less likely to form a natural oxide film on its surface in the atmosphere. Such microcrystalline thin films in contact with each other can easily be bonded directly. This bonding may not be performed in the atmosphere, but may be performed in a reduced pressure environment, or in an environment with a pressure higher than the atmospheric pressure. The bonding may not be performed in the atmosphere, but may be performed in a nitrogen or inert gas environment. The bonding may be performed at room temperature. Further, the structures to be bonded may be heated as appropriate to accelerate diffusion between the bonding films. To allow direct bonding at room temperature in the atmospheric pressure environment, the metallic thin films at the surfaces to be bonded may contain, as their main constituent, a metal having positive free energy of formation of oxides at room temperature. Metals with positive free energy of formation of oxides at room temperature include Au and Pt. To increase the bonding strength between a metallic layer containing Au or Pt as its major constituent with an insulating layer of ceramic for example, the surface of the ceramic insulating layer may be covered with an underlayer of, for example, tantalum (Ta), titanium (Ti), chromium (Cr), or nickel (Ni), and the metallic layer containing Au or Pt as its major constituent may be formed on the surface of the underlayer. The metallic film may be, for example, a film of a carbide, such as tungsten carbide (WC).

The metallic films 51 and 52 are bonded with this bonding method to form the second layer 46 bonding the first structure 20 and the second structure 30. The metallic film 51 deposited on the inner surface of each first recess 29 and the metallic film 52 deposited on the inner surface of each second recess 39 form the first layer 42 deposited on the inner surface of each channel 40. In this electrostatic chuck 1, the first and second structures 20 and 30 are bonded strongly by the second layer 46. This bonding method allows relatively easy formation of the first layer 42 on the entire inner surface of each of the channels 40 that are arranged in a complex pattern across the mounting surface 3, and allows relatively low-cost preparation of the mounting member including the first layers 42 and the second layer 46. The manufacturing method according to the present embodiment yields the electrostatic chuck 1 with relatively high mechanical strength at a relatively low cost.

Although one embodiment has been described above, the present invention is not limited to the above embodiment. For example, although the above embodiment describes the electrostatic chuck to be incorporated in an exposure apparatus used in the field of semiconductor manufacturing apparatuses as an example of the mounting member, the mounting member may be, for example, a vacuum suction chuck. The mounting member may not be for an exposure apparatus, and may be for use in a film formation apparatus or an etching apparatus. The applicable industrial filed may not be the field of semiconductor manufacturing apparatuses. The invention may be changed, modified, and combined variously without departing from the spirit and scope of the invention.

REFERENCE SIGNS LIST 1 electrostatic chuck
2 object
3 mounting surface
7 through-hole
8 bottom
9 protrusion
10 surrounding wall
20 first structure
21 first insulating layer
22 heater
23 second insulating layer
24 attracting electrode layer
25 third insulating layer
30 second structure
32 fourth insulating layer
40 channel
44 fluid
46 bonding layer

What is claimed is:

1. A mounting member, comprising:
a body having a surface including a mounting surface on which an object is mountable;
a channel arranged in the body; and
a first layer arranged on an inner surface of the channel, the first layer having a first layer thermal conductivity higher than a thermal conductivity of the body,
wherein
the body includes a second layer arranged within the body to avoid the channel as viewed in a top view, the second layer having a second layer thermal conductivity higher than the thermal conductivity of the body, and the first layer and the second layer are connected; and
the second layer extends across an entire area inward from an outermost periphery of the channel to avoid the channel as viewed in a top view.

2. The mounting member according to claim 1, wherein the second layer in the body is located within a range of a height of the channel at a cross-section perpendicular to the mounting surface.

3. The mounting member according to claim 1, wherein the first layer and the second layer are conductive.

4. The mounting member according to claim 1, wherein the first layer and the second layer contain the same major constituent.

5. The mounting member according to claim 1, wherein the body includes a first structure including the mounting surface, and a second structure arranged at an opposite surface of the first structure opposite to the mounting surface, and
the second layer is between the first structure and the second structure, and bonds the first structure and the second structure.

6. The mounting member according to claim 5, wherein the first structure includes a first recess that is a groove on the opposite surface of the first structure, and the inner surface of the channel includes an inner surface of the first recess.

7. The mounting member according to claim 5, wherein the second structure includes a second recess that is a groove on a surface of the second structure adjacent to the first structure, and the inner surface of the channel includes an inner surface of the second recess.

8. The mounting member according to claim 5, wherein the first structure includes a first recess that is a groove on the opposite surface of the first structure opposite to the mounting surface, and the second structure includes a second recess that is a groove on a surface of the second structure adjacent to the first structure, and
the inner surface of the channel includes an inner surface of the first recess and an inner surface of the second recess.

9. The mounting member according to claim 5, wherein the first structure includes an electrode configured to generate an electrostatic force for attracting the object toward the mounting surface when a voltage is applied to the electrode, and
the first layer and the second layer are conductive.

10. The mounting member according to claim 1, wherein the first layer contains gold as a major constituent.

11. The mounting member according to claim 1, wherein the first layer is arranged on the entire inner surface of the channel.

12. A mounting member, comprising:
a body having a surface including a mounting surface on which an object is mountable;
a channel arranged in the body; and
a first layer arranged on an inner surface of the channel, the first layer having a first layer thermal conductivity higher than a thermal conductivity of the body,
wherein
the body includes a second layer arranged within the body to avoid the channel as viewed in a top view, the second layer having a second layer thermal conductivity higher than the thermal conductivity of the body, and the first layer and the second layer are connected; and
the body includes a first structure including the mounting surface, and a second structure arranged at an opposite surface of the first structure opposite to the mounting surface, and
the second layer is between the first structure and the second structure, and bonds the first structure and the second structure.

13. The mounting member according to claim 12, wherein the first structure includes a first recess that is a groove on the opposite surface of the first structure, and the inner surface of the channel includes an inner surface of the first recess.

14. The mounting member according to claim 12, wherein the second structure includes a second recess that is a groove on a surface of the second structure adjacent to the first structure, and the inner surface of the channel includes an inner surface of the second recess.

15. The mounting member according to claim 12, wherein the first structure includes a first recess that is a groove on the opposite surface of the first structure opposite to the mounting surface, and the second structure includes a second recess that is a groove on a surface of the second structure adjacent to the first structure, and
the inner surface of the channel includes an inner surface of the first recess and an inner surface of the second recess.

16. The mounting member according to claim 12, wherein the first structure includes an electrode configured to generate an electrostatic force for attracting the object toward the mounting surface when a voltage is applied to the electrode, and
the first layer and the second layer are conductive.

17. The mounting member according to claim 12, wherein the first layer contains gold as a major constituent.

18. The mounting member according to claim 12, wherein the first layer is arranged on the entire inner surface of the channel.

\* \* \* \* \*